United States Patent [19]

Krishna

[11] Patent Number: 4,734,382
[45] Date of Patent: Mar. 29, 1988

[54] BICMOS PROCESS HAVING NARROW BIPOLAR EMITTER AND IMPLANTED ALUMINUM ISOLATION

[75] Inventor: Surinder Krishna, Fremont, Calif.

[73] Assignee: Fairchild Semiconductor Corporation, Cupertino, Calif.

[21] Appl. No.: 17,387

[22] Filed: Feb. 20, 1987

[51] Int. Cl.[4] .................... H01L 21/383; H01L 21/425
[52] U.S. Cl. .......................... 437/31; 437/26; 437/33; 437/47; 437/57; 437/163; 437/164
[58] Field of Search .................. 437/26, 31, 33, 47, 437/57, 163, 164; 148/188

[56] References Cited

U.S. PATENT DOCUMENTS

| | | | |
|---|---|---|---|
| 4,381,953 | 5/1983 | Ho et al. | 357/34 X |
| 4,484,388 | 11/1984 | Iwasaki et al. | 437/59 |
| 4,507,847 | 4/1985 | Sullivan | 437/57 X |
| 4,512,816 | 4/1985 | Ramde et al. | 148/1.5 |
| 4,521,952 | 6/1985 | Riseman | 357/15 X |
| 4,531,282 | 7/1985 | Sakai et al. | 357/34 X |
| 4,536,945 | 8/1985 | Gray et al. | 437/57 |

Primary Examiner—George T. Ozaki
Attorney, Agent, or Firm—Lee Patch; Robert C. Colwell

[57] ABSTRACT

A bipolar/CMOS process includes bipolar transistors having emitters formed in less than a minimal masking dimension. An opening is formed through a polycrystalline silicon layer deposited on a silicon substrate. After coating the sides of the opening with silicon dioxide, the intrinsic base region of the bipolar transistor and the emitter region are implanted. The extrinsic base is formed by outdiffusion from the polycrystalline silicon layer. The structure includes an epitaxial layer which is more strongly doped below its surface than at its surface to enhance the performance of CMOS transistors formed therein. Additionally, the bipolar and complementary MOS transistors are self-aligned to each other by the manner in which the buried layers are formed.

12 Claims, 5 Drawing Figures

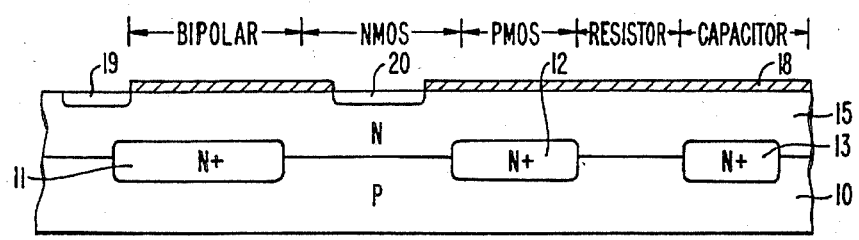
FIG._1.
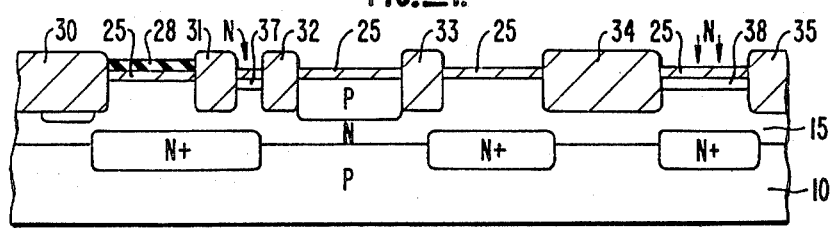
FIG._2.
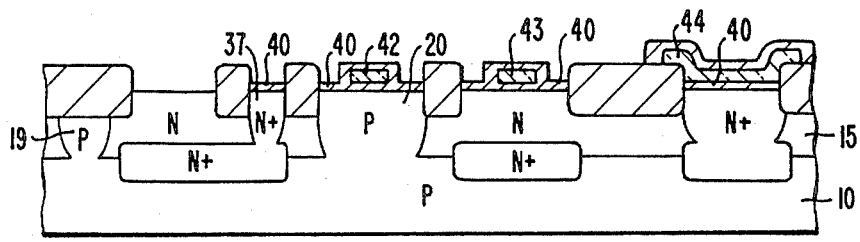
FIG._3.
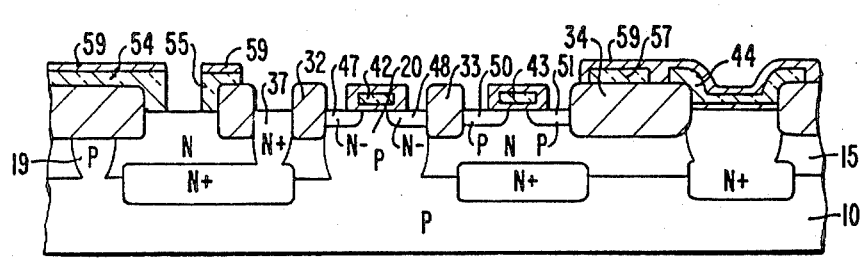
FIG._4.
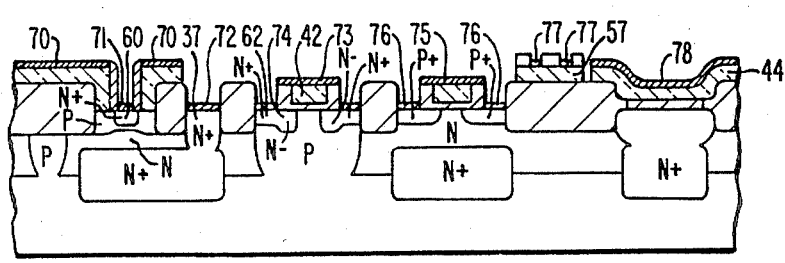
FIG._5.

BICMOS PROCESS HAVING NARROW BIPOLAR EMITTER AND IMPLANTED ALUMINUM ISOLATION

BACKGROUND OF THE INVENTION

1. Field of the Invention

This invention relates to processes for fabricating integrated circuits, especially those having both bipolar and field effect transistors. More particularly, the invention relates to a process for fabricating such circuits in which a sub-micron diffused bipolar emitter is formed in a strongly doped epitaxial layer.

2. Description of the Prior Art

Bipolar and field effect semiconductor (CMOS) technologies have each been independently understood for many years. The ability to combine complementary field effect devices ("CMOS") with bipolar devices on the same integrated circuit has raised new possibilities for very large scale integration. For example, bipolar output drivers may be employed with CMOS memories to provide more drive current. Because MOS circuits operate slower as temperature rises, while bipolar circuits operate faster, a CMOS bipolar combination ("BiCMOS") may be employed to make circuits less speed sensitive to temperature. Combining fast bipolar transistors with dense MOS transistors on the same integrated circuit permits the integration of complex functions with high yields. The CMOS transistors with their inherently low power requirements have large noise margins, while the bipolar devices have an advantage in switching speed and greater current drive per unit area.

Accordingly, much effort has been devoted by process scientists and engineers toward methods of integrating bipolar and CMOS processes on a single wafer. Unfortunately, to date the resulting BiCMOS processes generally are not optimized for either the CMOS or the bipolar aspect, consisting instead of a brute force combination of the process steps required to fabricate each type device. The result is often a lengthy and complicated process using a large number of masking operations, which is vulnerable to lower yields as a result of the complexity of the process. Typical prior art bipolar-CMOS processes are found in U.S. Pat. No. 4,484,388 to Iwasaki; U.S. Pat. No. 4,507,847 to Sullivan; and U.S. Pat. No. 4,536,945 to Gray et al. The use of aluminum isolation in integrated circuits is shown in Ramde et al., U.S. Pat. No. 4,512,816.

SUMMARY OF THE INVENTION

The process of my invention provides a technique for fabricating both bipolar and CMOS transistors on a common substrate, while combining the speed and drive capability of the bipolar devices with the packing density and power dissipation of CMOS devices. Assitionally, my process provides high performance analog functions in mixed analog/digital circuits. While the number of masking operations is comparable to those found in technologies where the bipolar and CMOS processes are merely combined, using my process the performance of devices manufactured is an order of magnitude faster. Furthermore, in my process the location of transistors with respect to each other is self-aligned. The buried layer under the bipolar and P-channel MOS devices align those transistors with respect to each other, while the isolation regions, defined in the same processs operation as the P-wells for the N-channel field effect devices, align the bipolar devices with the NMOS devices. Thus, the CMOS and bipolar devices are aligned with respect to each other. The bipolar emitter is formed in less than a critical masking dimension to improve noise and switching performance. Additionally, the use of aluminum for isolation and in the P-wells allows the use of thin low resistivity epitaxial layers to enable superior bipolar performance.

In a preferred embodiment a method of fabricating a semiconductor structure according to my invention includes the steps of forming an N-conductivity type epitaxial layer having a lower surface in contact with an underlying substrate and having an upper surface, and introducing N-conductivity type impurity into the epitaxial layer to provide a first impurity concentration of at least $1 \times 10^{16}$ atoms per cubic centimeter at the upper surface and a higher second impurity concentration between the upper and lower surfaces.

BRIEF DESCRIPTION OF THE DRAWING

FIG. 1 is a cross-sectional view of a semiconductor structure after formation of an epitaxial layer and doping of the isolation regions and P-well.

FIG. 2 is a subsequent cross section after oxidation of the isolation regions.

FIG. 3 is a subsequent cross-sectional view after formation of gates for the field effect devices and a capacitor.

FIG. 4 is a subsequent cross-sectional view after deposition of a second layer of polycrystalline silicon and doping of the sources and drains.

FIG. 5 is a cross-sectional view of the completed structure.

DETAILED DESCRIPTION OF THE PREFERRED EMBODIMENTS

FIG. 1 is a cross-sectional view of a semiconductor structure fabricated using a <100> P-type silicon substrate 10 having resistivity on the order of 2–4 ohm centimeters. About 5000 Angstroms of silicon dioxide (not shown) are grown thermally on the upper surface of substrate 10. Using well known photolithographic techniques, a layer of photoresist is defined and patterned to serve as a mask for the formation of regions where buried layers are desired. A suitable N-conductivity type impurity, for example, $5 \times 10^{15}$ atoms per square centimeter of arsenic introduced at 80 KeV is implanted through the openings in the mask to form buried layers 11, 12, and 13. Because buried layers are formed wherever bipolar transistors, P-channel MOS transistors, or capacitors are desired, the bipolar and PMOS devices are automatically aligned to each other. After implantation, the structure is heated to diffuse the arsenic further into the substrate 10, and the silicon dioxide is stripped from the surface using a well known etchant.

Using well known fabrication techniques, an epitaxial silicon layer 15 about 2.2 microns thick is deposited across the upper surface of the substrate. In the preferred embodiment, using ion implantation, epitaxial layer 15 is doped with N-type impurity to provide an impurity concentration of about $1 \times 10^{16}$ atoms per cubic centimeter.

After formation of epitaxial layer 15, the structure is oxidized by heating in an oxidizing ambient to form about 2000 Angstroms of silicon dioxide 18. Again, using well known photolithographic techniques, a mask is defined on the upper surface of silicon dioxide 18, and the silicon dioxide 18 etched away wherever isolation regions between bipolar and CMOS structures or wherever P-well regions are desired. After removal of the silicon dioxide, aluminum and boron are introduced into the surface of epitaxial layer where it is not protected by silicon dioxide 18. In the preferred embodiment, this process is carried out by conventional ion-implantation processes.

When the aluminum and boron are implanted, they are introduced into the substrate only in locations where P-wells such as 20 are desired, and in other regions to isolate the bipolar devices from each other and from the CMOS devices. For example, aluminum and boron are introduced into region 19 to form an isolation region to separate the bipolar device from the neighboring NMOS device. No boron and aluminum implant is required to isolate the CMOS devices from each other because subsequently formed oxide isolation will separate them from each other. FIG. 1 illustrates the appearance of the structure after both boron and aluminum have been implanted.

Next, as shown by FIG. 2, the structure is heated to drive the dopants deeper into the epitaxial layer, preferably to about 0.5 micron deep. Then, a silicon dioxide layer 25 about 250 Angstroms thick is formed across the upper surface of the structure. Next, about 1200 Angstroms of silicon nitride 28 are deposited across the upper surface of oxide 25 using chemical vapor deposition or other well known processes. The nitride layer 30 then is masked and etched, again using well known processes, to expose those regions where oxidized isolation regions are desired.

Then the structure is again heated, this time is high pressure oxygen, to form the field oxide regions 30, 31, 32, 33, 34, and 35, which are about 6000-7000 Angstroms thick. During this process, some of the P-type dopant introduced in the isolation regions is driven further into the epitaxial layer 15 beneath the field oxide regions. These P-doped regions prevent channel inversion from occurring beneath the isolation regions. The isolation regions are formed in an annular configuration to surround the active devices, and thereby electrically isolate each active device from all other devices in the same wafer. For example, isolation regions 30 and 31 in FIG. 2 are cross sections of a closed loop at the surface of epitaxial layer 15 which completely surrounds the region in which a bipolar transistor will be formed. Regions 32 and 33 in FIG. 2 provide an annular isolation region for the NMOS device. Region 34 is a larger isolation region where a resistor is desired.

Next, another mask is formed, and the silicon nitride layer removed from the bipolar collector contact region (between oxide isolation 31 and 32), from the surface of the epitaxial layer over the CMOS devices and from the capacitor region. Only silicon nitride region 28 over the bipolar emitter/base region is allowed to remain. About 250 Angstroms of silicon dioxide then are formed over the exposed silicon, and the structure masked to protect all of the structure except where a bipolar collector contact and capacitors are desired. Then N-type impurity, preferably phosphorus, at a dose of $5 \times 10^{15}$ atoms per square centimeter, is implanted into these regions. The N-type impurity forms a collector contact 37 and a capacitor electrode 38. After implanting the structure is heated to further drive in the isolation regions, P-well, and collector sink. The appearance of the structure after this step is shown in FIG. 2.

After implanting the N-conductivity type dopant into the bipolar collector region 37 and the capacitor region 38, a well-known blanket ion implantation step is performed to adjust the threshold voltage of the field effect transistors. The implant is introduced into all of the NMOS and PMOS device regions.

Silicon dioxide layer 25 then is etched from the surface of the epitaxial layer 15 using a conventional wet-etching process. The structure is introduced into a furnace and heated in an oxidizing ambient to form a new layer of silicon dioxide 40 across the upper surface. Silicon dioxide 40 will serve as the gate electrode dielectric for the NMOS and PMOS transistors, as well as the dielectric for the capacitor. In the preferred embodiment, gate oxide 40 is approximately 200 Angstroms thick. Next, a layer of polycrystalline silicon approximately 3500 Angstroms thick is deposited across the entire upper surface of the wafer using chemical vapor deposition. This first layer of polycrystalline silicon is implanted with about $1 \times 10^{16}$ atoms per square centimeter of phosphorus at 50 KeV and annealed. Using well known photolithographic techniques, the polycrystalline silicon is masked and defined into gates 42 and 43 for the CMOS devices and a capacitor electrode 44 for the capacitor. The structure is then heated to form a layer of silicon dioxide across the exposed regions of the polycrystalline silicon 42, 43, and 44. Because of the different oxidization rates of the epitaxial layer 15 and the polycrystalline silicon, a thicker layer of silicon dioxide forms on the gates and capacitor electrode than on the epitaxial layer. Then, the silicon nitride layer 28 (see FIG. 2) is removed using a well known process, and the underlying silicon dioxide 25 etched away. The etching reduces the thickness of unprotected silicon dioxide everywhere else on the wafer. The appearance of the structure after this step is shown in FIG. 3.

Next, a masking layer (not shown) is formed across all of the upper surface of the structure except the NMOS region between oxide isolation 32 and 33. (As explained above, regions 32 and 33 are cross sections of an annular region of silicon dioxide which surrounds the NMOS region.) Phosphorus then is implanted into the exposed NMOS region to form the source and drain 47 and 48. The relatively thicker electrode 42 prevents the introduced impurity from doping the substrate beneath the gate 42 thereby providing a self-aligned structure. In the preferred embodiment a dose of phosphorus of approximately $1 \times 10^{13}$ atoms per square centimeter introduced at 40 KeV is employed.

The mask is removed, and a new mask formed (not shown) which exposes the PMOS device area. Then, boron is implanted to form the PMOS source and drain regions 50 and 51. In the preferred embodiment, approximately $2 \times 10^{14}$ atoms per square centimeter of boron is implanted at 25 KeV. After implantation, the mask is removed.

Next, a second layer of polycrystalline silicon is deposited across the entire upper surface of the structure using low pressure chemical vapor deposition. The second layer of polycrystalline silicon 54, 55 is approximately 4500-5000 Angstroms thick, and is doped P-conductivity type with a boron implantation of approximately $4 \times 10^{15}$ atoms per square centimeter at 25 KeV. After doping, the polycrystalline silicon is oxidized to form about 700 Angstroms of silicon dioxide on its upper surface. A mask is formed across the polycrystalline silicon to define the base contact regions of the bipolar transistors and the resistors. Using the mask, the undesired polycrystalline silicon is etched away to leave base contacts 54 and 55 and resistor 57. Silicon dioxide layer 59 is shown on top of each of these polycrystalline silicon regions. The appearance of the structure at this stage of the process is shown in FIG. 4.

Next, a layer of silicon dioxide approximately 3000 Angstroms thick is deposited across the surface of the entire structure using a low temperature chemical vapor deposition process. A reactive ion etch of this layer is performed which removes all of the silicon dioxide from the surface of the emitter 60 and collector 37. Silicon dioxide remains on the sidewalls and on top of both the first and second layers of polycrystalline silicon. A mask is formed over all of the structure except the opening between the base contacts 54 and 55. Then boron is implanted through the opening to form the intrinsic base. When the implant is annealed some of the impurity in the base contacts 54 and 55 will diffuse into the underlying silicon to dope the extrinsic base.

Then, a mask is formed across the surface of the structure which exposes the emitter 60 and collector contact 37 of the bipolar transistor, as well as the source and drains 62 of the NMOS transistor. An arsenic implant of $1 \times 10^{16}$ atoms per square centimeter at 25 KeV forms the emitter 60, and the heavily doped portion 62 of the NMOS source and drain regions. By virtue of the earlier, lighter implant, the NMOS device will have a lightly doped drain structure, the polycrystalline silicon on the sides of electrode 42 being thicker during this layer implant than during the earlier implant.

The structure is subjected to a reactive ion etching process to remove the silicon dioxide from the upper surface of the first and second layers of polycrystalline silicon. Then, a layer of platinum, approximately 200 Angstroms thick, is deposited and reacted with the underlying silicon to form platinum silicide. For the bipolar transistor, the platinum silicide will form base contacts 70, emitter contacts 71, and a collector contact 72. For the NMOS device, a gate connection 73 to the electrode is formed, as well as source and drain electrodes 74. Similarly, for the PMOS device, gate electrode connection 75 and source and drain electrodes 76 are formed. During the same operation, contacts 77 are made to spaced-apart regions on resistor 57, and contact 78 is made to capacitor electrode 44. The unreacted platinum is stripped from the surface of the structure, and a layer of tungstentitanium about 1200 Angstroms thick is deposited across the structure. This is followed by a layer of conventional aluminum/silicon which is masked to define the first layer of metal. Then, the structure is processed using conventional techniques to define additional layers of metal and intermetal dielectric.

The process of my invention offers substantial advantages over conventional processes for fabricating both bipolar and CMOS transistors in the same substrate. The use of a strongly doped epitaxial layer enhances the performance of the bipolar devices. The process does not compromise the performance of the bipolar devices. The use of sidewall oxide allows the fabrication of the bipolar emitter in less than one critical dimension. Latchup is prevented by the buried layer beneath the PMOS devices which lowers the gain of the vertical PNP parasitic transistor to about 0.08. For latchup to occur, the product of the gains of the lateral NPN and vertical PNP transistors must be greater than one. By lowering the gain of the vertical PNP device this far, latchup will be prevented.

Although in the foregoing description numerous specific details about the process of my invention have been provided, these details were set forward to explain the process and not to limit it. The scope of my invention may be ascertained from the appended claims.

I claim:

1. A method of fabricating a semiconductor structure comprising:
    depositing an electrically conductive layer on an underlying region of first conductivity type semiconductor material, the layer including opposite conductivity type impurity;
    removing a first region of the layer extending to the underlying region to thereby provide an opening having sides;
    forming a coating of selected material on the sides of the opening;
    introducing opposite conductivity type impurity through the opening to thereby form a first doped region in the underlying region;
    introducing first conductivity type impurity through the opening to thereby form a second doped region in the first doped region;
    treating the structure to cause some of the opposite conductivity type impurity in the electrically conductive layer to diffuse into the semiconductor material to thereby form a third doped region in contact with the first doped region but not the second doped region; and
    providing electrical connections to each of the electrically conductive layers and the second doped region.

2. A method as in claim 1 wherein the step of removing a first region comprises an isotropically etching electrically conductive layer.

3. A method as in claim 2 wherein the electrically-conductive layer comprises polycrystalline silicon.

4. A method as in claim 3 wherein the step of forming a coating comprises covering at least the sides of the opening with a coating comprising silicon dioxide.

5. A method as in claim 4 wherein the first conductivity type is N.

6. A method as in claim 4 wherein each of the steps of introducing impurity comprises ion implantation.

7. A method as in claim 4 wherein the step of treating the structure comprises heating.

8. A method as in claim 4 wherein the step of providing electrical connections comprises depositing a silicide-forming metal and then reacting that metal with the polycrystalline silicon to form a metal silicide.

9. A method as in claim 1 wherein prior to the step of depositing an electrically-conductive layer a process is performed comprising:
    forming an N conductivity type epitaxial layer having a lower surface in contact with an underlying substrate and an upper surface.

10. A method as in claim 9 further comprising forming isolation regions extending through the epitaxial layer to the substrate by the steps of introducing aluminum into the epitaxial layer wherever isolation regions are desired, and oxidizing the epitaxial layer in those regions.

11. A method as in claim 10 wherein the step of introducing aluminum further comprises also introducing boron.

12. A method as in claim 11 wherein the semiconductor structure comprises a structure for the fabrication of both bipolar and field effect transistors and wherein the step of introducing aluminum further comprises introducing aluminum and boron also into those regions of the epitaxial layer where N channel field effect transistors are to be formed.

* * * * *